United States Patent
Ogata et al.

(10) Patent No.: US 9,548,207 B2
(45) Date of Patent: Jan. 17, 2017

(54) METHOD OF ETCHING A SILICON SUBSTRATE

(71) Applicant: CANON KABUSHIKI KAISHA, Tokyo (JP)

(72) Inventors: Yoshinao Ogata, Kawasaki (JP); Masataka Kato, Hiratsuka (JP); Masaya Uyama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/322,235

(22) Filed: Jul. 2, 2014

(65) Prior Publication Data
US 2015/0024604 A1 Jan. 22, 2015

(30) Foreign Application Priority Data
Jul. 19, 2013 (JP) ................. 2013-150188

(51) Int. Cl.
*H01L 21/302* (2006.01)
*H01L 21/461* (2006.01)
*B44C 1/22* (2006.01)
*C03C 15/00* (2006.01)
*C03C 25/68* (2006.01)
*C23F 1/00* (2006.01)
*H01L 21/3065* (2006.01)
*H01L 21/311* (2006.01)

(52) U.S. Cl.
CPC ..... *H01L 21/3065* (2013.01); *H01L 21/30655* (2013.01); *H01L 21/311* (2013.01); *H01L 21/31105* (2013.01); *H01L 21/31111* (2013.01)

(58) Field of Classification Search
None
See application file for complete search history.

(56) References Cited

U.S. PATENT DOCUMENTS

| 5,501,893 A * | 3/1996 | Laermer ............. H01L 21/3065 216/67 |
| 6,187,685 B1 * | 2/2001 | Hopkins et al. ............... 438/710 |
| 2004/0097077 A1 * | 5/2004 | Nallan ................ B81C 1/00619 438/689 |
| 2004/0256353 A1 * | 12/2004 | Panda et al. .................... 216/18 |
| 2007/0131652 A1 * | 6/2007 | Okune .................. H01J 37/321 216/67 |
| 2009/0242512 A1 * | 10/2009 | Beaudry .......... H01L 21/30655 216/49 |
| 2013/0029491 A1 * | 1/2013 | Lee ..................... H01L 21/3065 438/696 |

FOREIGN PATENT DOCUMENTS

JP 2006-148156 A 6/2006

* cited by examiner

*Primary Examiner* — Stephanie Duclair
(74) *Attorney, Agent, or Firm* — Fitzpatrick, Cella, Harper & Scinto

(57) ABSTRACT

A method of etching a silicon substrate, in which a depressed portion is formed by etching a first surface of the silicon substrate with ions generated in plasma, the method including introducing a rare gas into a reaction system to ionize the rare gas.

6 Claims, 4 Drawing Sheets

METHOD OF ETCHING A SILICON SUBSTRATE

BACKGROUND OF THE INVENTION

Field of the Invention

The present invention relates to a method of etching a silicon substrate.

Description of the Related Art

U.S. Pat. No. 5,501,893 and Japanese Patent Application Laid-Open No. 2006-148156 disclose techniques of forming a trench in a silicon substrate (hereinafter, also "Si substrate") by a dry plasma etching. In the methods of U.S. Pat. No. 5,501,893 and Japanese Patent Application Laid-Open No. 2006-148156, for an Si substrate on which an etching mask has been formed, the deposition of a protection film, the etching of the protection film and the etching of the Si substrate are repeated so that a trench is formed in the Si substrate.

In the deposition step, the protection film is formed on the surface of the etching mask, the sidewall of the trench, and the bottom of the trench. In the etching step for the protection film, a bias is applied to substrate electrodes, directionality is given to ions in the plasma, and the protection film formed on the bottom of the trench is removed. On this occasion, the protection film formed on the sidewall of the trench remains without being removed. Next, in the etching step for the Si substrate, a portion of the Si substrate exposed from the protection film at the bottom of the trench is etched. Thereafter, these deposition step and etching steps are repeated so that the trench is formed in the Si substrate.

SUMMARY OF THE INVENTION

The present invention is a method of etching a silicon substrate, in which a depressed portion is formed by etching a first surface of the silicon substrate with ions generated in plasma, comprises introducing a rare gas into a reaction system to ionize the rare gas.

Further features of the present invention will become apparent from the following description of exemplary embodiments with reference to the attached drawings.

DESCRIPTION OF THE EMBODIMENTS

Figure 1A:
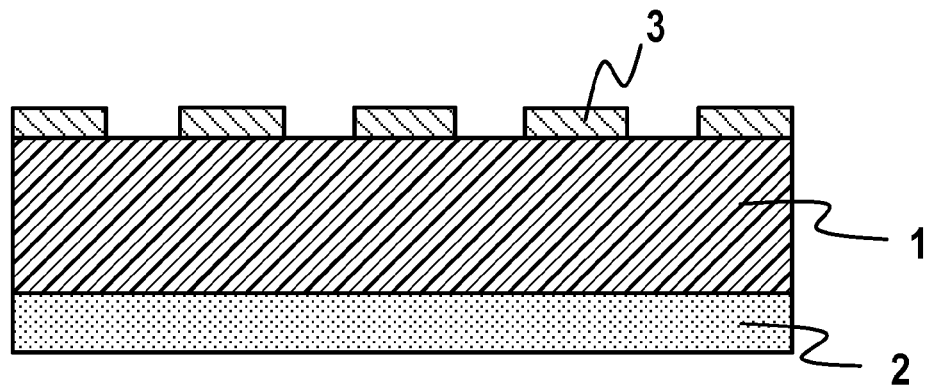
FIGS. 1A, 1B and 1C are schematic cross-sectional diagrams for describing a charged state of a substrate when notching occurs.

Preferred embodiments of the present invention will now be described in detail in accordance with the accompanying drawings.

In production of a semiconductor device, when a depressed portion (for example, a trench) is formed in an Si substrate, an insulation layer is sometimes used as an etching stop layer. On this occasion, in the etching methods of U.S. Pat. No. 5,501,893 and Japanese Patent Application Laid-Open No. 2006-148156, a phenomenon called notching occurs. It is generally known that this phenomenon is caused by charging during the etching. In the etching, there is a tendency that ions in plasma accumulate on the bottom of the trench and electrons in the plasma accumulate on the front surface of the substrate (the top of the trench). However, when the etching reaches the insulation layer, which is the etching stop layer, charging occurs on the insulation layer. This charging causes the trajectory of ions for etching the bottom of the trench to be bent. As a result, etching (notching) occurs on the sidewall of the trench. Furthermore, there is a tendency that this notching occurs remarkably if the trench has a high aspect ratio, for example, if the trench has a narrow opening width or if the trench is deep.

Further, in the methods of U.S. Pat. No. 5,501,893 and Japanese Patent Application Laid-Open No. 2006-148156, when performing the etching of the protection film or the etching of the Si substrate, the charging on the protection film and the Si substrate sometimes causes the inhibition of efficient etching, and causes the occurrence of etching in the plane direction (horizontal direction) of the substrate surface.

Hence, an object of the present invention is to provide a method of etching a silicon substrate that enables the reduction in etching in the plane direction (horizontal direction) of the substrate surface, when etching an Si substrate with ions generated in plasma to form a depressed portion.

In the following, an embodiment of the present invention will be described with reference to the drawings. Note that the present invention is not limited to the embodiment described later.

In a method of etching a silicon substrate according to the present invention, the silicon substrate is etched with ions generated in plasma to form a depressed portion. Further, the method of etching the silicon substrate according to the present invention includes introducing a rare gas into a reaction system to ionize the rare gas. By ionizing the rare gas, it is possible to remove the charge that is generated in the silicon substrate and the like. The depressed portion to be obtained by the present invention may be a non-through hole, or may be a through hole. Preferably, the depressed portion is a through hole.

Further, in the embodiment, the depressed portion can be formed by repeating a step (1) of forming a protection film in an opening of a non-through hole formed in a Si substrate, a step (2) of etching a protection film portion which is formed on the bottom of the opening with ions, and a step (3) of etching a portion of the Si substrate which is exposed at the bottom of the opening with the ions, in this order. The protection film can be formed by a deposition method.

For example, U.S. Pat. No. 5,501,893 discloses a time division multiplex method. The time division multiplex method enables a depressed portion (for example, a trench structure) to be formed by etching an Si substrate in plasma.

Figure 1B:
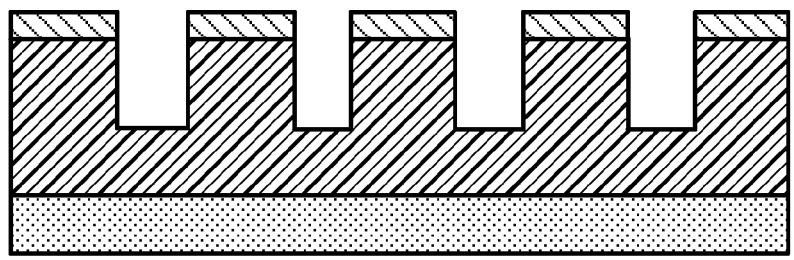
Figure 1C:
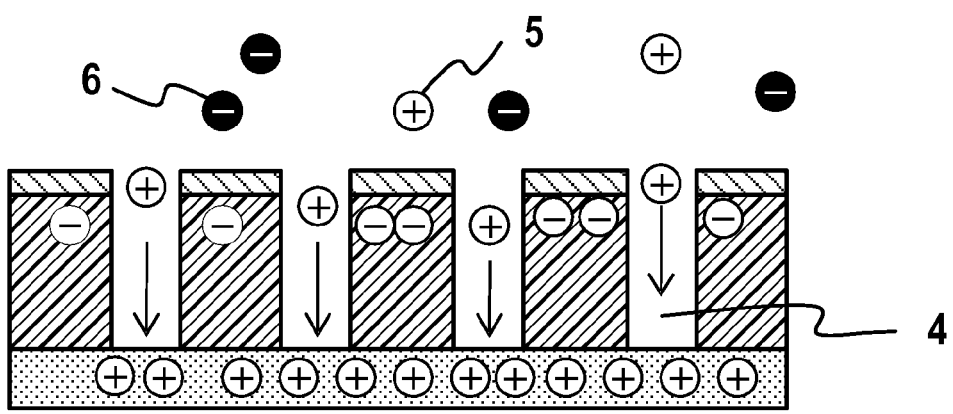

FIGS. 1A to 1C are schematic cross-sectional diagrams illustrating a step of forming a depressed portion 4 by repeating the formation of a protection film, the etching of the protection film and the etching of a silicon substrate. In FIG. 1A, an etching mask 3 having a pattern opening is formed on a first surface (front surface) of the silicon substrate. Further, an etching stop layer 2 is provided on a second surface (back surface), which is the surface opposite to the first surface of the silicon substrate. The etching stop layer 2 is an insulation layer composed of an insulator. In FIG. 1B, the depressed portion is formed by repeating the formation of the protection film (step (1)), the etching of the protection film (step (2)) and the etching of the silicon substrate (step (3)). More concretely, an etching mask 3, which has a pattern opening for exposing an etching start surface, is used as a mask, and a substrate 1, which is a silicon substrate, is etched. An opening of a non-through hole is thereby formed. Next, the protection film is formed on the sidewall and bottom of the opening, by a deposition method or the like (step (1)). Next, a protection film portion formed on the bottom of the opening is etched with ions so that the silicon substrate is exposed (step (2)). Next, a portion of the silicon substrate exposed at the bottom of the opening is etched with ions (step (3)). Thereafter, the steps (1) to (3) are repeated in this order so that the depressed portion 4 is formed. In FIGS. 1A to 1C, the silicon substrate is etched until the opening reaches the etching stop layer 2, so that the depressed portion 4 is formed.

On this occasion, for example, as shown in the schematic cross-sectional diagram of FIG. 1C, the etching stop layer 2 is positively charged, and the front surface side of the silicon substrate is negatively charged. In FIG. 1C, the front surface of the substrate is charged by free electrons 6, and the etching stop layer 2 is charged by positive ions (for example, $SF_6$ ions). Therefore, as described above, there is a tendency that the etching proceeds in the plane direction (horizontal direction) of the substrate surface to cause notching. Also, in the etching of the protection film portion on the bottom of the opening, ions accumulate on the bottom of the opening, and electrons accumulate on the front surface of the substrate. That is, the bottom of the opening is positively charged, and the front surface of the substrate is negatively charged. As a result, the negative charging on the front surface of the substrate and the positive charging within the opening sometimes inhibit ions in the plasma from entering the opening. Accordingly, in some cases, the etching of the protection film and the etching of the silicon substrate are not efficiently performed, and the etching in the plane direction of the substrate proceeds. This phenomenon appears more remarkably, when the opening has a high aspect ratio.

Figure 2A:
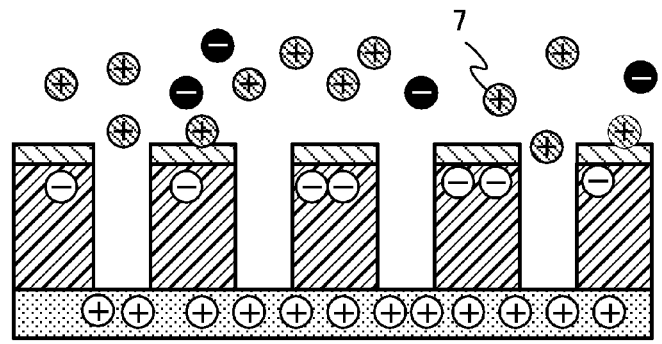
FIGS. 2A, 2B, 2C and 2D are schematic cross-sectional diagrams for describing a theory for charging removal in the present invention.
Figure 2B:
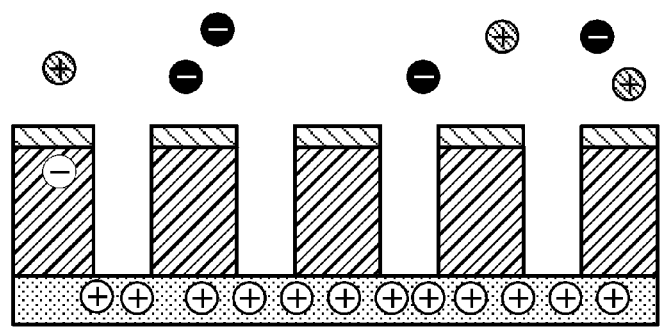
Figure 2C:
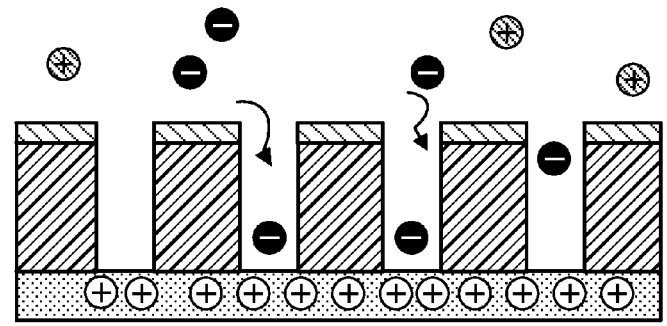
Figure 2D:
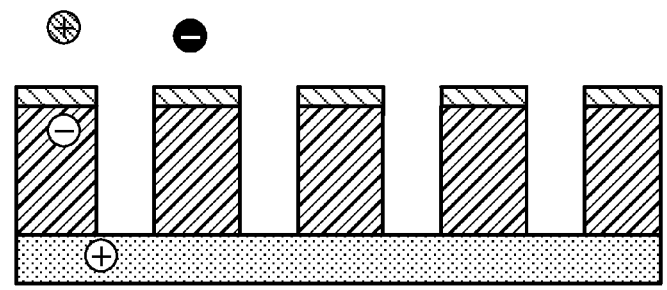

Hence, in order to actively remove the charging generated in the reaction system, for example, the negative charging on the front surface of the substrate and the positive charging on the bottom of the opening, the embodiment introduces a rare gas into the reaction system and ionizes the rare gas. By the ionization of the rare gas, positive ions of the rare gas are generated, and as shown in FIG. 2B, the positive ions destaticize the negative charging on the front surface of the substrate. When the negative charging on the front surface of the substrate is destaticized, the free electrons in the plasma can easily enter the opening. Then, as shown in FIG. 2D, the free electrons having entered the opening destaticize the positive charging on the bottom of the opening. As a result, the protection film and the silicon substrate can be etched in a state in which the interior of the opening is destaticized, allowing for efficient etching. Further, the notching can be reduced.

Here, any gas to be positively ionized can eliminate the charging on the front surface of the substrate. However, a gas other than the rare gas, for example, $SF_4$ or $CF_4$, has a high reactivity, and greatly damages the etching mask. Therefore, in the present invention, a rare gas, which has a low reactivity, is used. Examples of the rare gas include He (helium), Ne (neon) and Ar (argon).

As a unit to ionize the rare gas, a radio frequency power source provided in an apparatus can be used. The radio frequency power source discharges electricity to the rare gas introduced into the reaction system of the apparatus, and thereby, the rare gas can be ionized into plasma. In addition, the rare gas may be ionized using a laser.

The introduction and ionization of the rare gas are performed in the repetition of the formation of the protection film (step (1)), the etching of the protection film (step (2)) and the etching of the Si substrate (step (3)). The timing when the introduction and ionization of the rare gas are performed is not particularly limited, and for example, can be the following timing.

(A) The introduction and ionization of the rare gas are performed during a temporary suspension of the etching of the protection film in the step (2). That is, a time for performing the introduction and ionization of the rare gas is provided in the step (2) for the protection film, separately from a time for etching the protection film, and the etching step (2) for the protection film is performed such that the etching of the protection film and the removal of the charging are alternately performed.

(B) The introduction and ionization of the rare gas are performed during a temporary suspension of the etching of the silicon substrate in the step (3). That is, a time for performing the introduction and ionization of the rare gas is provided in the step (3) for the silicon substrate, separately from a time for etching the silicon substrate, and the etching step (3) for the silicon substrate is performed such that the etching of the silicon substrate and the removal of the charging are alternately performed.

(C) The introduction and ionization of the rare gas are performed while the protection film portion formed on the bottom of the opening is being etched in the step (2).

(D) The introduction and ionization of the rare gas are performed while a portion of the silicon substrate exposed on the bottom of the opening is being etched in the step (3).

(E) the introduction and ionization of the rare gas are performed between the step (2) and the step (3).

Figure 3A:
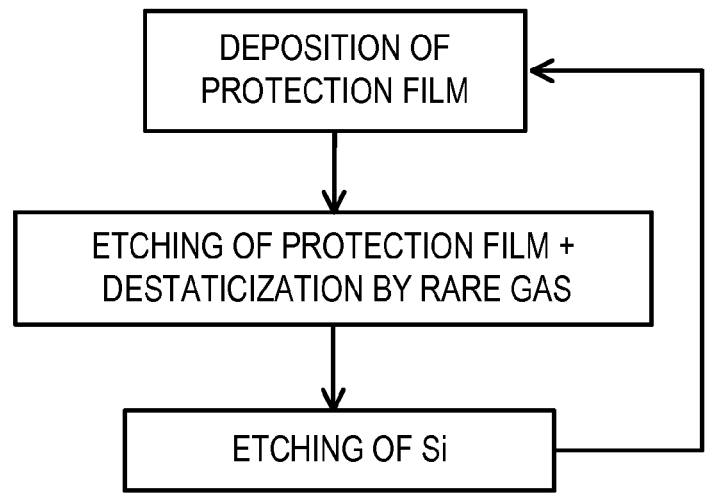
FIGS. 3A and 3B are flowcharts illustrating configuration examples according to an embodiment of the present invention.
Figure 3B:
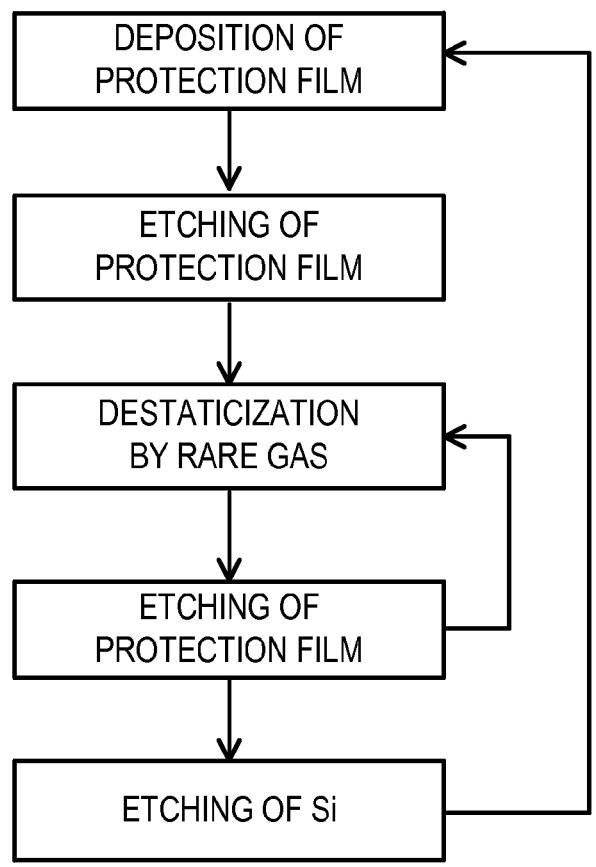

For example, in the etching of the protection film, as for the timing for the introduction of the rare gas, for example, the rare gas can be introduced simultaneously with the etching of the protection film, with the bias of the substrate electrodes being applied, as shown in FIG. 3A (corresponding to the above described (C)). Further, as shown in FIG. 3B (corresponding to the above described (A)), in the etching step for the protection film, the time is provided separately from the etching of the protection film. Then, the application of the bias of the substrate electrodes is turned OFF, and the rare gas is introduced to be ionized. These timings both exhibit the effect of the present invention.

Therefore, in the case of FIG. 3A, after the protection film is formed by deposition or the like, the rare gas is introduced into the reaction system while the protection film is being etched. After the etching step (2) for the protection film is completed, the etching step (3) for the Si substrate is performed, and these steps are repeated. Here, the etching step (3) for the Si substrate may be also performed while the rare gas is being introduced into the reaction system to be ionized.

In the case of FIG. 3B, after the protection film is formed by deposition or the like, the etching of the protection film, the introduction and ionization of the rare gas (the removal of the charging), and the etching of the protection film are repeated as for the etching step (2) for the protection film. The step (2) is performed such that the introduction and ionization of the rare gas are separately performed during a temporary suspension of the etching of the protection film. Thereafter, the etching step (3) for the Si substrate is performed, and these steps are repeated. Naturally, the etching step (3) for the Si substrate may be also performed such that the introduction and ionization of the rare gas are separately performed during a temporary suspension of the etching of the silicon substrate.

Here, in the case of FIG. 3A, the introduction and ionization of the rare gas are performed simultaneously with the etching of the protection film, and therefore, the rare gas is introduced in a state in which the application of the bias of the substrate electrodes is ON. Therefore, compared to the method of FIG. 3B, the sputtering damage to the etching mask is greater in some cases. When the etching mask is relatively thin, there seems a possibility that the Si substrate is exposed from the etching mask so that the Si substrate which is not a region to be processed is also etched. Therefore, in the case of FIG. 3A, as the rare gas to be introduced, He and Ne can be used. He and Ne are relatively light gases among the rare gases, and therefore, enable to reduce the sputtering damage to the etching mask caused by the rare gas ions.

In the case of FIG. 3B, not simultaneously with the etching of the protection film but at the separately provided time, the introduction and ionization of the rare gas is performed in a state in which the application of the bias of the substrate electrodes is OFF. Therefore, the sputtering damage to the etching mask caused by the rare gas ions is less compared to the case where one of He and Ne is introduced by the method of FIG. 3A.

By the way, in the patterning of the etching mask by lithography, for improving the accuracy of the patterning, there is a method of applying thinly a resist for the etching mask. When using such a method, a thin etching mask is formed. Therefore, when intending to extremely reduce the damage to the etching mask, as shown in FIG. 3B, the introduction and ionization of the rare gas can be performed in a state in which the application of the bias of the substrate electrodes is OFF, at the time provided separately from the etching of the protection film or the silicon substrate.

Figure 4A:
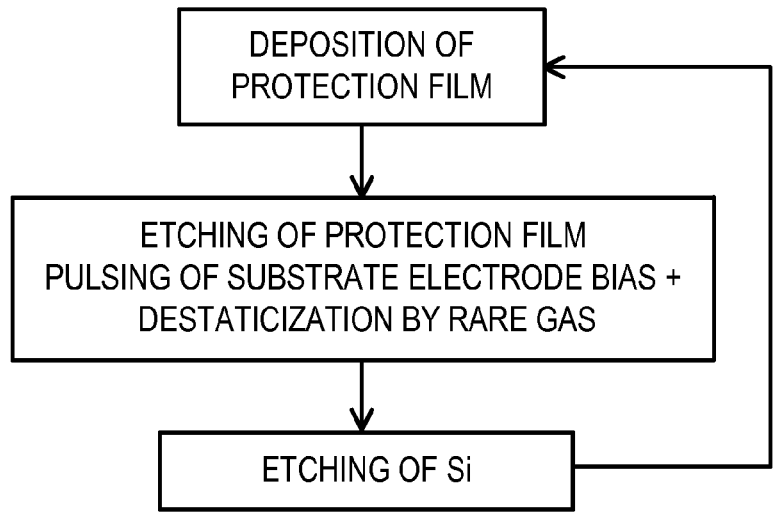
FIGS. 4A and 4B are flowcharts illustrating configuration examples according to the embodiment of the present invention.
Figure 4B:
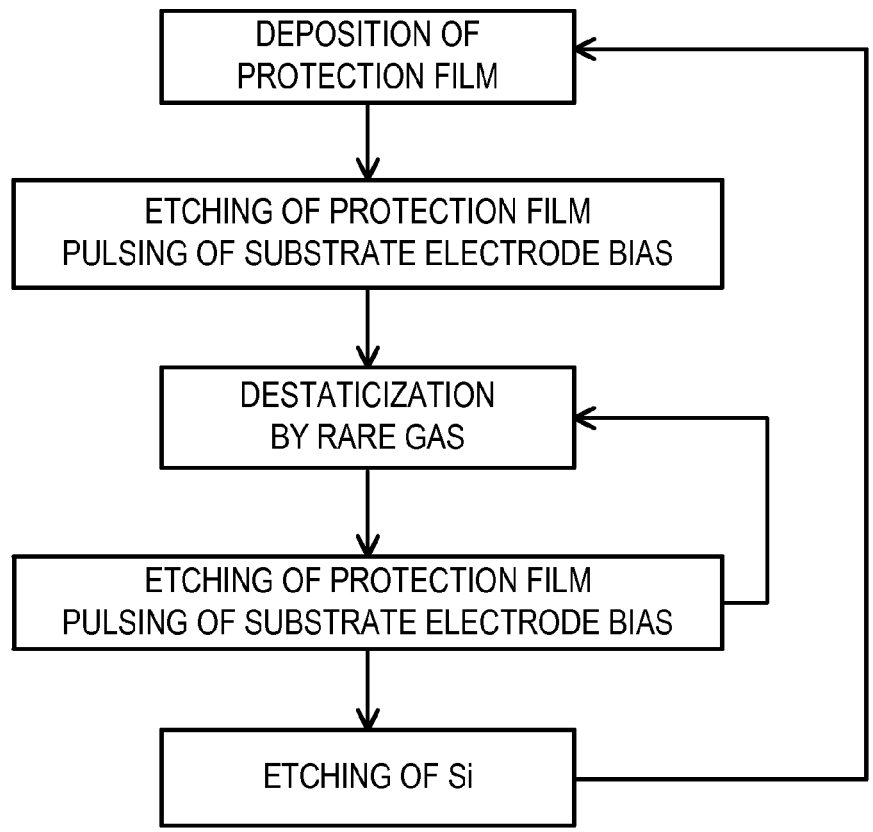

Furthermore, in both methods of FIG. 3A and FIG. 3B, at the time of etching the protection film or the silicon substrate, the application of the bias of the substrate electrodes may be pulsed, as shown in FIGS. 4A, 4B. As shown in Japanese Patent Application Laid-Open No. 2006-148156, the pulsed application of the bias of the substrate electrodes results in the effect of reducing notching. Also, in the present invention, it is expected that the pulsed application of the bias of the substrate electrodes exhibits the effect of reducing notching. Therefore, in the case of FIGS. 4A, 4B, both of the notching reduction effect by pulsing and the notching reduction effect by the rare gas are expected.

When the depressed portion (for example, a trench) formed in the Si substrate has a narrow opening width, and when the trench has a deep depth, there is a tendency that the notching by the charging and the etching in the plane direction of the substrate easily occur. Concretely, when the value of the depressed portion depth divided by the opening width of the depressed portion (aspect ratio) is 3 or more, the effect of the present invention is exerted particularly remarkably.

Example 1

In the following, Example 1 of the present invention will be described.

First, the substrate 1 of silicon single crystal was prepared. Then, the etching stop layer 2, as an insulation layer, was formed on the back surface of the substrate. Further, the etching mask 3 was formed on the front surface of the substrate so as to have a thickness of 15 μm. As for the etching stop layer 2, SiN was film-formed on the back surface of the substrate, using a chemical vapor deposition (plasma CVD, plasma-enhanced chemical vapor deposition). The etching mask 3 was formed by a lithography technique, using a photosensitive resin (IP-5700).

Next, through the etching mask 3, the dry etching of the substrate 1 was performed using ions generated from plasma, so that the depressed portion 4 having a trench structure was formed. For the dry etching, a time division multiplex (TDM) method was used. In the method, the formation of the protection film by deposition (step (1)), the etching of the protection film (step (2)) and the etching of the Si substrate (step (3)) were repeated. For the dry etching, an ICP (inductively coupled plasma) dry etching apparatus was used. As a raw material gas of the protection film, $C_4F_8$ was used, and as a gas for the etching, $SF_6$ was used.

As the etching condition in the example, the flow rate of $SF_6$ gas was 600 sccm, the flow rate of $C_4F_8$ gas was 600, and the gas pressure was 5 Pa.

Here, in the embodiment, as the etching condition, the flow rate of an etching gas such as $SF_6$ gas can be 50 to 1000 sccm, and the flow rate of a raw material gas of the protection film such as $C_4F_8$ gas can be 50 to 1000 sccm. The gas pressure can be 0.1 to 50 Pa, particularly 0.5 to 5 Pa.

In the example, in the etching step (2) for the protection film, the protection film was etched while the rare gas was being introduced for destaticization. As the rare gas, He was used, and was introduced into the ICP (inductively coupled plasma) dry etching apparatus to be ionized, so that rare gas ions 7 were generated.

In the example, as the condition of the introduction and ionization of the He rare gas, the flow rate of He was 100 sccm, and the gas pressure was 5 Pa.

Here, in the embodiment, as the condition of the introduction and ionization of the rare gas such as He, the flow rate of the rare gas can be 50 to 1000 sccm, and the gas pressure can be 0.5 to 5 Pa.

As shown in FIG. 3A, in the etching step for the protection film, He was introduced simultaneously with the etching of the protection film (the application of the bias of the substrate electrodes is ON).

As a result, the rare gas ions 7 removed the charging on the front surface of the substrate. Since the negative charging on the front surface of the substrate was removed, the free electrons 6 in the plasma entered the opening. Then, the free electrons 6 having entered the opening removed the positive charging on the bottom of the opening.

The etching step for the protection film was performed in a state in which the charging on the opening was removed by the introduction of the rare gas. After the etching of the protection film portion on the bottom of the opening was completed, the etching of the Si substrate (step (3)) was performed.

Thereafter, the formation of the protection film by deposition (step (1)), the etching of the protection film (with the introduction of the rare gas) (step (2)) and the etching of the Si substrate (step (3)) were repeated, so that the depressed portion was formed in the Si substrate.

In the example, the etching of the protection film could be efficiently performed, and the depressed portion 4 could be formed such that the occurrence of the notching was reduced.

Here, in the example, He was used as the rare gas, but other rare gases such as Ne and Ar can also exhibit the effect of the present invention. By using He, which is the lightest gas in the rare gases, the sputtering damage by the ions can be suppressed.

Example 2

In the following, Example 2 of the present invention will be described. The differences from Example 1 are the thickness of the etching mask 3 and the timing of the introduction of the rare gas.

Similarly to Example 1, the etching stop layer 2 and the etching mask 3 were formed on the substrate 1. On this occasion, for improving the accuracy of the patterning of the etching mask, a thinner etching mask (a thickness of 10 µm) was formed than that in Example 1.

Next, by the same method as that in Example 1 except the following, the dry etching of the substrate 1 was performed through the etching mask 3 so that the depressed portion 4 was formed. On this occasion, as shown in FIG. 3B, in the etching step for the protection film, the introduction and ionization of the rare gas were performed at the time made separately from the etching of the protection film. That is, the application of the bias of the substrate electrodes was temporarily turned OFF in the etching of the protection film. Then, the rare gas was introduced to be ionized, and the destaticization was performed. As the rare gas, He was used, and was introduced into the ICP (inductively coupled plasma) dry etching apparatus to be ionized.

In the example, as the condition of the introduction and ionization of the He rare gas, the flow rate of He was 100 sccm, and the gas pressure was 5 Pa.

Here, in the embodiment, as the condition of the introduction and ionization of the rare gas such as He, the flow rate of the rare gas can be 50 to 1000 sccm, and the gas pressure can be 0.5 Pa to 5 Pa.

After the charging on the bottom of the opening was removed by the introduction and ionization of the rare gas, the introduction of the rare gas was stopped. Then, the application of the bias of the substrate electrodes was turned ON again, and the etching of the protection film was resumed. The introduction of the rare gas and the etching of the protection film were repeated multiple times, and the etching of the protection film (step (2)) was performed.

After the etching step (2) for the protection film was completed, the etching step (3) for the Si substrate was performed.

Thereafter, the formation of the protection film by deposition (step (1)), the etching of the protection film (the introduction and ionization of the rare gas during a temporary suspension of the etching) (step (2)) and the etching of the Si substrate (step (3)) were repeated so that the depressed portion was formed in the Si substrate.

In the example, the etching of the protection film could be efficiently performed, and the depressed portion 4 could be formed such that the occurrence of the notching was reduced.

Example 3

In the following, Example 3 of the present invention will be described. The difference from Example 1 is the bias condition of the substrate electrodes at the time of the etching of the protection film.

As shown in FIG. 4A, the bias of the substrate electrodes was pulsed.

In the example, the condition of the bias pulse of the substrate electrodes was set such that the frequency region is 400 Hz.

Here, in the embodiment, the condition of the bias pulse can be set to 20 Hz to 500 Hz.

Since the bias of the substrate electrodes was pulsed, the depressed portion could be formed such that the occurrence of the notching was further reduced compared to Example 1.

The method of etching the silicon substrate according to the embodiment, without being particularly limited, can be used for production of a semiconductor device, for example. More concretely, the method can be used for formation of a supply port of a liquid ejection head, for example. That is, the method of etching the silicon substrate according to the embodiment can be suitably applied to a production method for a liquid ejection head that includes a liquid ejection orifice, a liquid passage communicated with the liquid ejection orifice, and a liquid supply port for supplying liquid to the liquid passage. In this case, the liquid supply port can be formed as the depressed portion.

The present invention can provide the method of etching the silicon substrate that enables reducing the etching in the plane direction (horizontal direction) of the substrate surface, when etching the Si substrate with the ions generated in plasma to form the depressed portion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-150188, filed on Jul. 19, 2013, which is hereby incorporated by reference herein in its entirety.

What is claimed is:

1. A method of etching a silicon substrate, in which a depressed portion is formed by etching a first surface of the silicon substrate with ions generated in plasma, the method comprising steps of:
   (1) forming a protection film in a non-through hole formed in the silicon substrate;
   (2) etching a protection film portion formed on a bottom of the non-through with the ions; and
   (3) etching a portion of the silicon substrate exposed at the bottom of the non-through with the ions,
   wherein the depressed portion is formed by repeating the steps (1), (2), and (3) in this order,
   wherein the method further comprises introducing an ionized rare gas to the silicon substrate,
   wherein the etching of the portion of the silicon substrate and the introduction of the ionized rare gas are not simultaneously performed,
   wherein the introduction of the ionized rare gas is performed during a temporary suspension of the etching of the protection film portion in the step (2) after the etching of the protection film portion has started, and the etching of the protection film portion in step (2) is resumed, and
   wherein a gas used for the etching of the portion of the silicon substrate does not contain the ionized rare gas.

2. The method according to claim 1, wherein an electric discharge is produced in the rare gas using a radio frequency power source to generate plasma to ionize the rare gas.

3. The method according to claim 1, wherein a bias applied to a substrate electrode is pulsed when the protection film is etched.

4. The method according to claim 1, wherein an etching stop layer is formed on a second surface opposite to the first surface, and the etching is performed until reaching the etching stop layer.

5. The method according to claim 1, wherein the gas used for the etching of the portion of the silicon substrate is $SF_6$ or $CF_4$.

6. The method according to claim 1, wherein the ionized rare gas comprises an ionized helium gas.

* * * * *